United States Patent [19]

Janda

[11] Patent Number: 4,609,126

[45] Date of Patent: Sep. 2, 1986

[54] VENTING CAP FOR APPARATUS HOUSING

[75] Inventor: George M. Janda, Wheaton, Ill.

[73] Assignee: GTE Communications Systems Corporation, Northlake, Ill.

[21] Appl. No.: 804,966

[22] Filed: Dec. 5, 1985

[51] Int. Cl.[4] ............................................. B65D 51/16
[52] U.S. Cl. ...................................... 220/374; 220/367
[58] Field of Search ................. 220/367, 373, 374, 256

[56] References Cited

U.S. PATENT DOCUMENTS 4,081,107 3/1978 Martin, Jr. et al. ................... 220/373
4,360,122 11/1982 Sullivan ................................ 220/373

Primary Examiner—George T. Hall
Attorney, Agent, or Firm—Robert J. Black

[57] ABSTRACT

A vented cap for covering an apparatus housing utilized in an outdoor environment including a pair of spaced apart roof panels defining therebetween a chamber. Apertures in the room panels out of registry with each other provide a path for ventilation of the enclosure while preventing the ingress of environmental elements such as rain. Mesas are raised above the surface of the inner roof panel and each contains one of the inner apertures. Drain apertures are formed around the periphery of the vented cap assist in permitting egress of environmental elements from and ingress of cooling air to the chamber.

17 Claims, 2 Drawing Figures

VENTING CAP FOR APPARATUS HOUSING

BACKGROUND OF THE INVENTION (1) Field of the Invention

The present invention relates to enclosures for use in a outdoor environment and, more particularly, to a vented cap for such an enclosure.

(2) Background Art

Enclosure caps are very well known to those skilled in the art. In this regard, U.S. Pat. No. 3,864,510 to Ramsey, Jr. et al. teaches a pedestal enclosure for buried cable including a body portion of rectangular cylindrical construction and a formed cap fastened to the body portion at an upper end thereof.

U.S. Pat. No. 4,003,610 to Main teaches a terminal housing having top and bottom walls shaped as inverted pans which support between them a forwardly arched arrangement of equipment and a perpendicularly continuous side wall enclosure which includes two doors hinged adjacent the rear of the panel arch and extending forward and across into overlapping relation at the front. A cap or cover having a depending peripheral flange is supported above the top wall in a normally raised position by springs in which position it clears the doors and allows them to open. An actuating lever is provided to move the cap downward over the top edges of the doors to secure them closed.

Additionally, U.S. Pat. No. 3,900,700 to Gaudet teaches a vented enclosure designed to protect electronic or other equipments from the elements in the out of doors. A plurality of apertures are formed in a rectangular cylindrical body portion at an upper end thereof which openings are protected from rain or splashed water by a spaced apart cover panel. The apertures permit convective movement of air out of the enclosure and cooperate with openings in the enclosure bottom to dissipate heat internally generated from therein contained equipment and heat generated by sun rays.

Finally, U.S. Pat. No. 3,868,080 to Olson teaches a protected telephone service termination including a channel-shaped stake, a plate secured to an upper end of the stake, a telephone circuit protector mounted to the plate and a cap adapted to slidingly cover the circuit protector to protect the circuit protector from the environment.

The above inventions are seen to address various methods of protecting equipment operating in the environment but none is seen to describe or teach a vented enclosure cap in the manner taught by Applicant's invention.

SUMMARY OF THE INVENTION

The present invention provides a vented cap for covering an apparatus housing intended for use in an outdoor environment including an inner roof panel engaged with a top end of a plurality of side walls of the housing and an outer roof panel attached to, positioned above and spaced apart from the inner roof panel defining therebetween a chamber. An aperture is formed in the outer roof panel and a least one aperture is formed in the inner roof panel, the inner roof panel aperture, the chamber and the outer roof panel aperture forming a passage for ventilating the interior space of the housing.

The roof panels may be peaked at a center point and slope downward toward peripheral edges to deflect and drain rain and like. The inner roof panel may include a plurality of mesa-shaped surfaces in which the inner panel apertures are formed, the mesa surfaces are raised above the inner roof panel to prevent precipitation entering the outer roof panel aperture from running down the inner roof panel and into the inner roof apertures. The space or chamber between the outer roof panel and inner roof panel is advantageously provided to form a thermal barrier for heat generated by direct radiation of the sun on the outer roof panel thereby protecting the enclosure from such generated heat.

BRIEF DESCRIPTION OF THE DRAWING

An understanding of the present invention will be apparent from the following description taken in conjunction with the accompanying drawing in which.

DESCRIPTION OF THE PREFERRED EMBODIMENT

Figure 1:
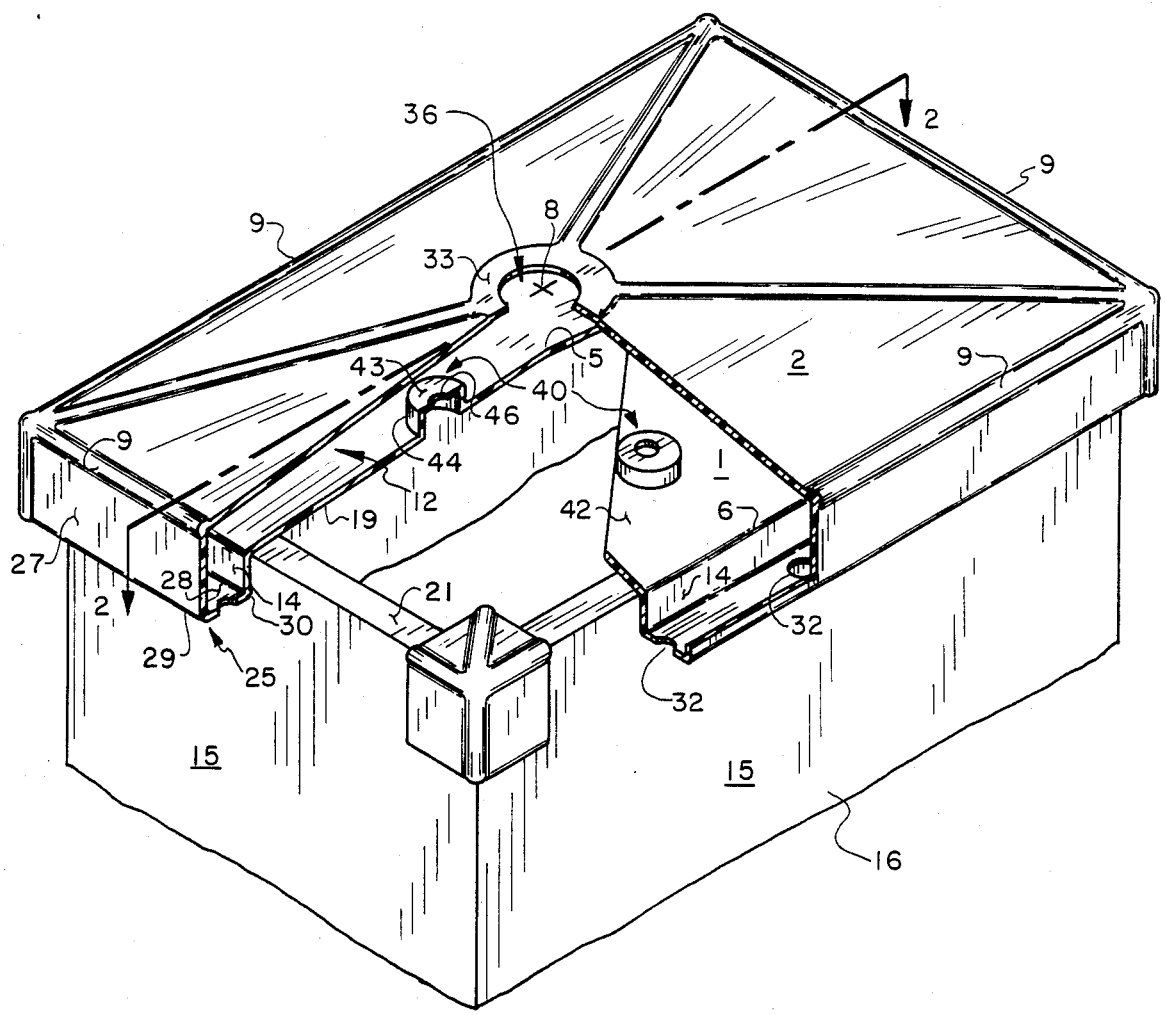
FIG. 1 is a perspective view of the subject invention mounted on an environmental apparatus housing.
Figure 2:
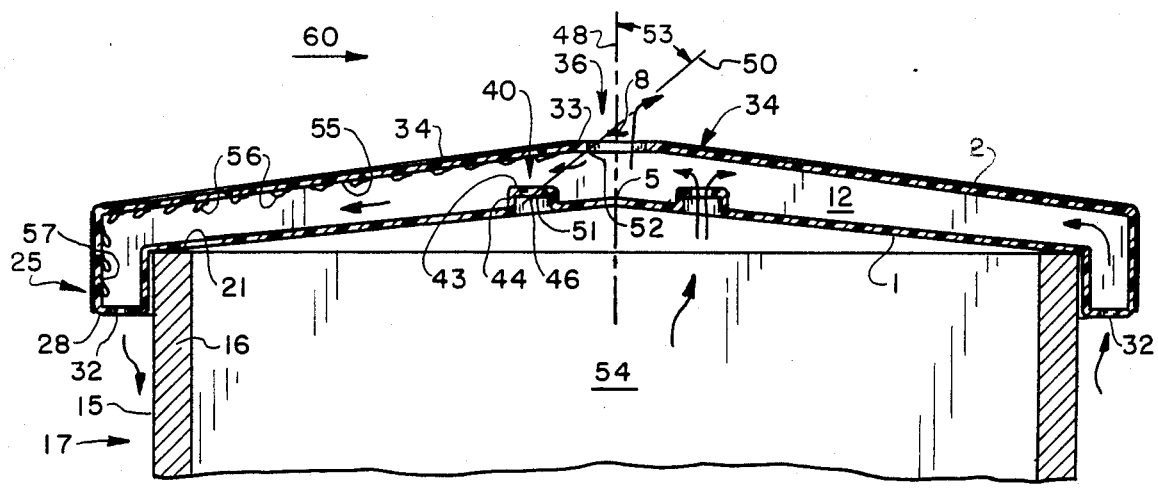
FIG. 2 is a cross-sectional view of the present invention taken along the line 2—2 in FIG. 1.

Referring now to FIGS. 1 and 2, there is shown a vented cap for covering an apparatus housing intended for use in an outdoor environment in accordance with the present invention including an inner roof panel 1 and an outer roof panel 2, the roof panels 1 and 2 both of hip roof construction, peaked at a center point and sloping downward and away towards peripheral edges. In this regard, the inner roof panel 1 may be peaked at a center point 5 and sloped downward and away towards a plurality of peripheral edges 6. Similarly the outer roof panel 2 may be peaked at a central high point 8 and sloped downwardly and away toward peripheral edges 9. The inner roof panel 1 and outer roof panel 2 are spaced apart a predetermined distance forming therebetween a chamber 12. Depending from each of the peripheral edges 6 of the inner roof panel 1 is a circumferentially continuous band 14. The band 14 is sized to fit about an outer surface 15 of a plurality of side walls 16 of an apparatus housing 17 intended for use in an outdoor environment. The inner roof panel 1 includes a lower surface 19 resting upon an upper edge 21 of the walls 16 of the apparatus housing 17 thereby to support the inner roof panel 1.

A circumferentially continuous flange 25 of L-shaped cross-section is provided to connect the upper roof panel 2 to the lower roof panel 1. The flange 12 includes a back portion 27 depending from the peripheral edge 9 of the upper roof panel 2 and a foot portion 28 extending inwardly from a lower edge 29 of the back portion 27 to a lower edge 30 of the band 14. The foot portion 28 may include a plurality of apertures 32 formed therethrough.

The upper roof panel 2 includes a horizontal surface 33 formed in the vicinity of the central high point 8. The surface 33 is formed to smoothly join the surrounding portion 34 of the outer roof panel 2 and includes therethrough an outer aperture 36. The inner roof panel 1 includes a plurality of mesas 40 extending above an upper surface 42 of the inner roof panel 1. The mesas 40 include a raised surface 43 and a sidewall 44 connecting the raised surface 43 to the inner roof panel 1. An aperture 46 is formed in each of the raised surfaces 43.

Referring now to FIG. 2, the apertures 46 and the raised surfaces 43 of the mesas 40 formed extending above the inner roof panel 1 are offset with respect to a vertical center line 48 passing through the aperture 36 formed in the surface 33 of the outer roof panel 2. The inner roof panel apertures 46 are offset to such a degree with respect to the outer roof panel apertures 36 such that a line 50 passing through a point 51 on the edge of the aperture 46 nearest most the aperture 36 and also through a point 52 on the aperture 36 nearest most the aperture 46 will form an acute angle 53 of between 45 and 60 degrees with respect to the vertical axis 48 of the aperture 36. Such an offset of the apertures 46 with respect to the apertures 36 and the placement of the apertures 46 on the mesas 40 will prevent precipitation in the form of rain or snow from passing through the apertures 36 and 46 thereby preventing it from entering an interior space 54 of the enclosure 17.

Ventilation of the interior 54 of the enclosure 17 is accomplished by permitting air to enter through openings (not shown) in the bottom of the enclosure 17 thereby to cool and ventilate equipment and apparatus provided therein. Heated air may exit the interior space 54 of the housing 17 by passage through the apertures 46 in the mesas 40 of the inner roof panel 1 into the chamber 12 between the inner roof panel 1 and the outer roof panel 2. The heated air may then exit from the chamber 12 through the aperture 36 in the surface 33 of the outer roof panel 2 to the atmosphere.

It will also be appreciated that the structure of the present invention is advantageously adapted to utilize the Bernoulli effect relating to a decrease in pressure of a gas as its velocity increases to assist in ventilating both the interior space 54 of the enclosure 17 and the chamber 12 between the inner roof panel 1 and the outer roof panel 2. In this regard, wind (indicated by arrow 60 in FIG. 2) passing the aperture 36 will cause a decrease in atmospheric pressure within the aperture. The decreased atmospheric pressure within the aperture 36 will draw air from the chamber 12 out the aperture 36 and into the atmosphere which air will be replaced both from the interior space 54 via the apertures 46 and from the atmospheric via the apertures 32.

The vented cap of the present invention additionally provides a thermal barrier for heat generated by direct conversion of solar radiation to heat on the surface of the vented cap. In this regard, the chamber 12 will act as a thermal insulation barrier for solar radiation converted to heat upon contact with the outer roof panel 2. Solar radiation falling on the outer roof panel 2 will be converted into thermal energy thereby heating the outer roof panel 2. The heated outer roof panel 2 will then give up heat to the air in the chamber 12 between the inner and outer roof panels thereby lightening the air and causing it to migrate towards the aperture 36 whereat it will pass through the apertures 36 and out into the atmosphere. The heated air is replaced by cool air entering the drain holes 32 in the foot portion 28 of the L-shaped flange 25.

The vented cap of the present invention additionally provides protection from moisture condensed out of the atmosphere within the inner space 54 of the enclosures 17 as may occur when a period of high humidity is followed by a period of cool temperatures. In this regard, humidity in the atmosphere within the enclosure 17 will migrate out the apertures 46 and into the chamber 12 whereat it will condense on an inner surface 55 of the outer roof panel 2. The condensed moisture will form droplets 56 on the inner surface 55 of the outer roof panel 2 and, by virtue of the sloped surface of the roof panel 2, run down the inner surface 5 to the flange 25, down an inner surface 57 of the back portion 27 and gather on the foot portion 28 wherefrom they will run out of the chamber 12 via the apertures 32. It will be appreciated that while the collection and disposition of moisture in the chamber 12 has been described, other atmospheric elements may be equally well accommodated such as snow and dust.

It will be appreciated that the present invention may be readily adapted to economical and efficient manufacturing processes using materials easily fabricated. In this regard, the vented cap may be of plastic construction blow-molded as a unitary assembly.

Although the preferred embodiment of the present invention has been illustrated, and the form described in detail, it will be readily apparent to those skilled in the art that various modifications may be made therein without departing from the spirit of the invention or from the scope of the appended claims.

What is claimed is:

1. A vented cap for covering an apparatus housing utilized in an outdoor environment comprising:
   an inner roof panel engaged with a top end of each of a plurality of side walls of said housing;
   an outer roof panel attached to, positioned above and spaced apart from said inner roof panel;
   an outer aperture formed in said outer roof panel; and
   at least one inner aperture formed in said inner roof panel;
   whereby an interior space of said housing is vented to said environment while being protected from a plurality of elements in said environment.

2. A cap as claimed in claim 1, wherein: said apertures in said inner and outer panels are out of vertical registry with each other.

3. A cap as claimed in claim 2, wherein: a line drawn through an edge of each said apertures at a point nearest said other aperture forms an acute angle to a vertical direction.

4. A cap as claimed in claim 3, wherein: said acute angle is preferably between angles of 45 degrees and 60 degrees.

5. A cap as claimed in claim 1, wherein: said inner roof panel includes a plurality of inner apertures all out of vertical registry with said outer panel aperture.

6. A cap as claimed in claim 1, wherein: said inner panel includes at least one surface raised above said inner roof panel in the form of a mesa, said inner panel aperture formed in said mesa.

7. A cap as claimed in claim 6, wherein: said raised surface is horizontally oriented.

8. A cap as claimed in claim 7, wherein: each of said roof panels is peaked at a center point and slopes downward toward a peripheral edge.

9. A cap as claimed in claim 8, wherein: said outer roof panel includes a surface formed in the vicinity of said center point, said surface smoothly joining a surrounding portion of said outer roof panel and said outer aperture formed in said surface.

10. A cap as claimed in claim 9, wherein: said surface is positioned parallel to a direction of movement of air in said environment and said outer aperture cooperates with said air to ventilate a chamber defined between said upper roof panel and said lower roof panel.

11. A cap as claimed in claim 1, wherein: said cap includes a continuous band depending from a peripheral edge of said inner roof panel, said band sized to slidingly engage an outer surface of said housing side walls.

12. A cap as claimed in claim 11, wherein: said outer roof panel is attached to said inner roof by a circumferentially continuous depending flange.

13. A cap as claimed in claim 12, wherein: said flange is of L-shaped cross-section and includes a vertical back depending from a peripheral edge of said outer roof panel, and an foot portion extending inward from a lower edge of said flange back portion to a lower edge of said band.

14. A cap as claimed in claim 13, wherein: said environment includes an atmosphere, said foot portion includes at least one aperture formed therein, said foot aperature permitting ingress of said atmosphere to and egress of said environmental elements from a chamber defined between said outer roof panel and said inner roof panel.

15. An apparatus as claimed in claim 1, wherein: said inner and outer roof panels are of unitary construction.

16. An apparatus as claimed in claim 1, wherein: said inner and outer roof panels are of plastic construction.

17. An apparatus as claimed in claim 16, wherein: said inner and outer roof panels are of blow-molded unitary construction.

* * * * *